United States Patent [19]
Hamasaki et al.

[11] Patent Number: 4,811,059
[45] Date of Patent: Mar. 7, 1989

[54] ALIGNMENT METHOD

[75] Inventors: Bunei Hamasaki, Yokohama; Shinji Utamura, Chofu; Akiya Nakai, Tokyo, all of Japan

[73] Assignee: Canon Kabushiki Kaisha, Tokyo, Japan

[21] Appl. No.: 104,582

[22] Filed: Oct. 2, 1987

Related U.S. Application Data

[63] Continuation of Ser. No. 008,917, Jan. 30, 1987, abandoned.

[30] Foreign Application Priority Data

Jan. 31, 1986 [JP] Japan .................................. 61-17881

[51] Int. Cl.$^4$ .............................................. G03B 27/32
[52] U.S. Cl. ........................................ 355/77; 355/43; 355/53
[58] Field of Search ...................... 355/77, 51, 53, 54, 355/43, 45, 100, 102, 86, 125, 92; 356/400, 401, 399, 218

[56] References Cited

U.S. PATENT DOCUMENTS

| | | | |
|---|---|---|---|
| 4,452,526 | 6/1984 | Johannsmeier et al. | ............... 355/43 |
| 4,669,866 | 6/1987 | Phillips | .............................. 355/53 X |
| 4,669,867 | 6/1987 | Uda et al. | ........................... 355/53 |

*Primary Examiner*—Richard A. Wintercorn
*Attorney, Agent, or Firm*—Fitzpatrick, Cella, Harper & Scinto

[57] ABSTRACT

An improved alignment method usable in a step-and-repeat type alignment and exposure apparatus for photolighographically transferring images of a pattern of a reticle onto different shot areas on a semiconductor wafer, for manufacture of semiconductor devices. According to this method, the alignment is executed with respect to an X direction, a Y direction and a rotational direction parallel to a plane containing the X and Y directions. With regard to the rotational direction, positional deviation of the wafer as a whole with respect to the reticle is measured and corrected prior to the initiation of the step-and-repeat photoprinting. With regard to the X and Y directions, detection and correction of any deviation are executed for each of the shot areas of the wafer. By this, high-accuracy and high-speed alignment is attainable for all the shot areas of the wafer.

9 Claims, 7 Drawing Sheets

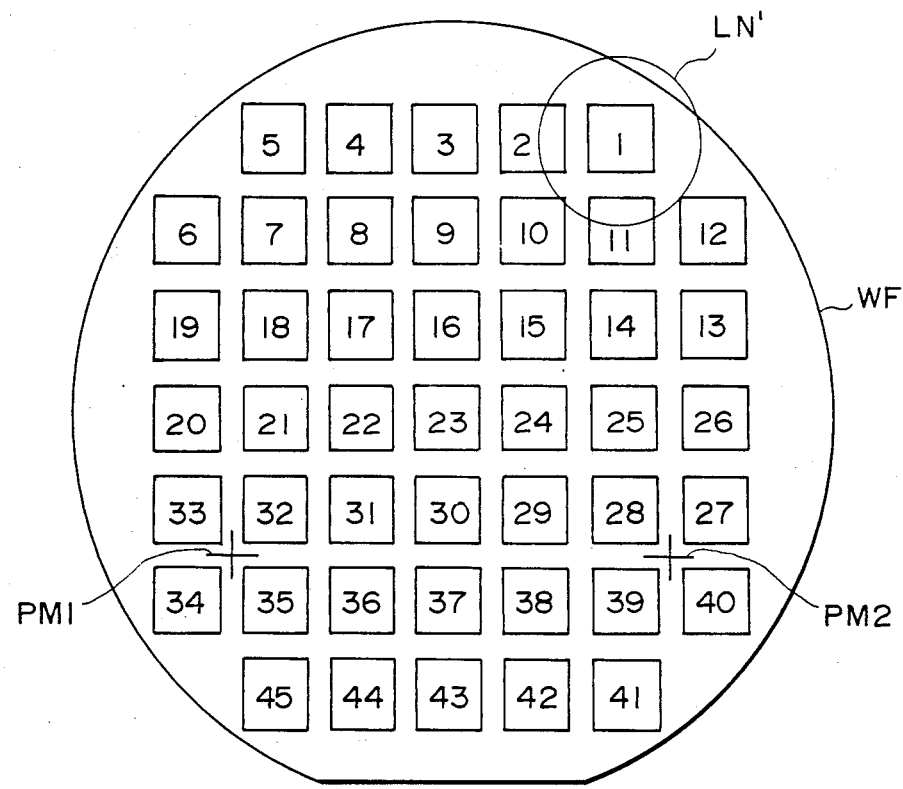
F I G. 2

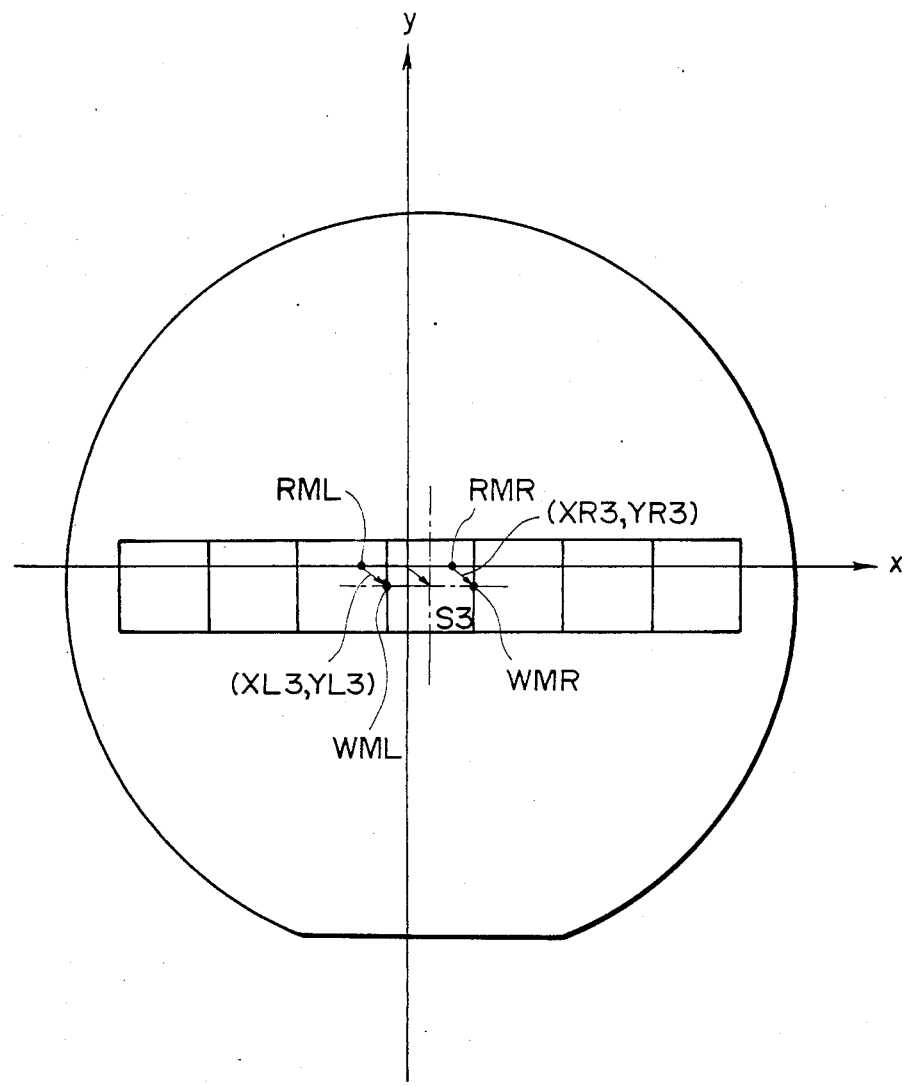
F I G. 7

ALIGNMENT METHOD

This application is a continuation of application Ser. No. 008,917 filed Jan. 30, 1987 now abandoned.

FIELD OF THE INVENTION AND RELATED ART

This invention relates to an alignment method and, more particularly, to an alignment method usable, in the manufacture of microcircuits such as high-capacity semiconductive integrated circuit chips, in step-and-repeat type alignment and exposure apparatuses for transferring images of a pattern of a reticle onto different portions of a semiconductor wafer in a step-and-repeat manner.

Exposure apparatuses used to photoprint circuit patterns on semiconductor wafers have shown drastic advancement along with developments in semiconductor integrating technology. Currently, there exists a variety of exposure apparatuses such as a contact exposure type, a proximity exposure type, a unit-magnification lens or mirror projection exposure type, a reduction projection exposure type, etc. The reduction projection exposure apparatus is arranged such that images of the pattern of the reticle are projected, in sequence, onto different portions of the wafer in a step-and-repeat manner, and this type of exposure apparatus is called "stepper".

As an example of alignment system employed in the stepper for reticle-to-wafer alignment purpose, there is a TTL (through the lens) die-by-die alignment system. According to this system, the reticle-to-wafer alignment is executed with respect to each of shot areas defined on the wafer, by use of or through a projection lens system of the stepper. Since the TTL die-by-die alignment system carries out the reticle-to-wafer alignment with respect to each of the shot areas on the wafer, high-accuracy alignment is attainable.

Conventionally, the TTL die-by-die alignment system executes detection and correction of the reticle-to-wafer deviation in respect to translational components and a rotational component. This will be described in terms of an X-Y-Z coordinate system having a Z axis extending in parallel to the optical axis of the projection lens system. Usually, for each of the shot areas on the wafer, the translational components $\Delta x$ and $\Delta y$ and the rotational component $\Delta \theta$ (in the plane containing the X and Y axes) of the positional deviation between the reticle and the wafer, are measured by way of the projection lens system and are corrected by means of a wafer stage which carries and holds the wafer. To measure and correct the rotational component of the positional deviation in each of the shot areas on the wafer, causes inconveniences such as follows:

(1) There is a high possibility that, with respect to almost all the shot areas on the wafer, the center of the shot area being subjected to the deviation measurement is out of coincidence with the center of rotation of the wafer established at that time by the wafer stage in relation to the shot area being subjected to the measurement. This requires that the measurement and correction of the deviation are achieved highly accurately.

(2) It follows therefrom that a longer time is necessary for the alignment.

SUMMARY OF THE INVENTION

It is accordingly a primary object of the present invention to provide a solution obviating the inconveniences described above.

It is another object of the present invention to provide an alignment method which assures high-accuracy alignment as well as high-speed alignment, thus contributing to improvements in the throughput of the exposure apparatus.

Briefly, in accordance with one preferred form of the present invention, to achieve these objects, there is provided an alignment method by which, with respect to the rotational component of the deviation, the rotational deviation of the wafer as a whole is measured and the measured rotational deviation is corrected by a single correcting movement, whereas, with respect to the translational components of the deviation, the detection and correction are executed with respect to each of the shot areas on the wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 2 is a schematic view showing an example of layout of shot areas on the wafer and alignment marks formed on the wafer.

FIG. 7 is a schematic view showing a wafer whose shot areas contain translational deviation components which are to be removed by TTL X-Y die-by-die alignment in accordance with one aspect of the present invention.

DESCRIPTION OF THE PREFERRED EMBODIMENTS

Figure 1:
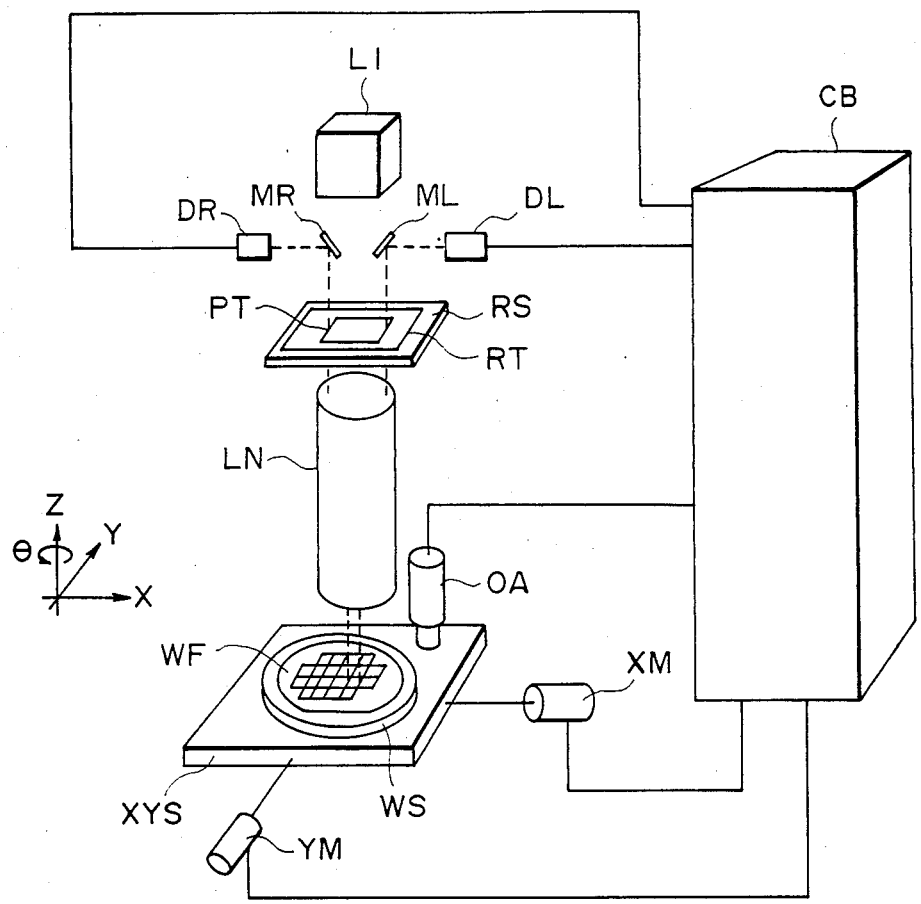
FIG. 1 is a schematic view generally showing the structure of an alignment and exposure apparatus for photoprinting patterns on a wafer, to which apparatus the alignment method of the present invention is applied.

Referring first to FIG. 1, there is shown a general structure of an alignment and exposure apparatus for photolithographically transferring images of a pattern of a reticle onto a wafer, to which apparatus an alignment method according to the present invention is applied. Denoted in FIG. 1 by characters XYS is an X-Y stage for carrying thereon a semiconductor wafer WF and for moving the same in X and Y directions with respect to an X-Y-Z coordinate system whose Z axis extends in parallel to an optical axis of a reduction projection lens LN; by XM, a driving motor for moving the X-Y stage XYS in the X direction; by YM, another driving motor for moving the X-Y stage XYS in the Y direction; by WS, a θ stage for rotationally moving the wafer WF in θ direction about the Z axis; by OA, an off-axis microscopic system arranged to detect prealignment marks PM1 and PM2 (see FIG. 2) of the wafer WF, for the purpose of relatively rough alignment of the wafer WF with respect to a reticle RT; by RS, a reticle stage for carrying thereon the reticle RT and for moving the same in each of the X, Y and θ directions; by PT, a fine pattern formed on the reticle RT for preparation of microcircuits such as integrated circuits; by LI, an illumination system for illuminating the reticle RT so as to photoprint an image of the pattern PT on a portion of the wafer WF, by way of the projection lens system LN; by MR and ML, mirrors; by DR and DL, photoelectric detectors; and CB, a control box having a control circuit which comprises a central processing unit (CPU), memories, etc. The projection lens system LN is adapted to project the image of the pattern PT onto the wafer WF in a reduced scale.

FIG. 2 shows an example of the layout of shot areas on the wafer WF which is the subject to be exposed. As shown in FIG. 2, the wafer WF has formed thereon prealignment marks PM1 and PM2 which are to be used for the prealignment purpose. Reference numerals 1–45 denote zones (or shot areas) of the wafer WF which are to be exposed to the reticle pattern RT in sequence in the numbered order, in the step-and-repeat manner. Denoted at LN' is a projection field of the projection lens system LN which is positioned relative to the wafer WF when the shot area 1 is to be exposed.

Figure 3:
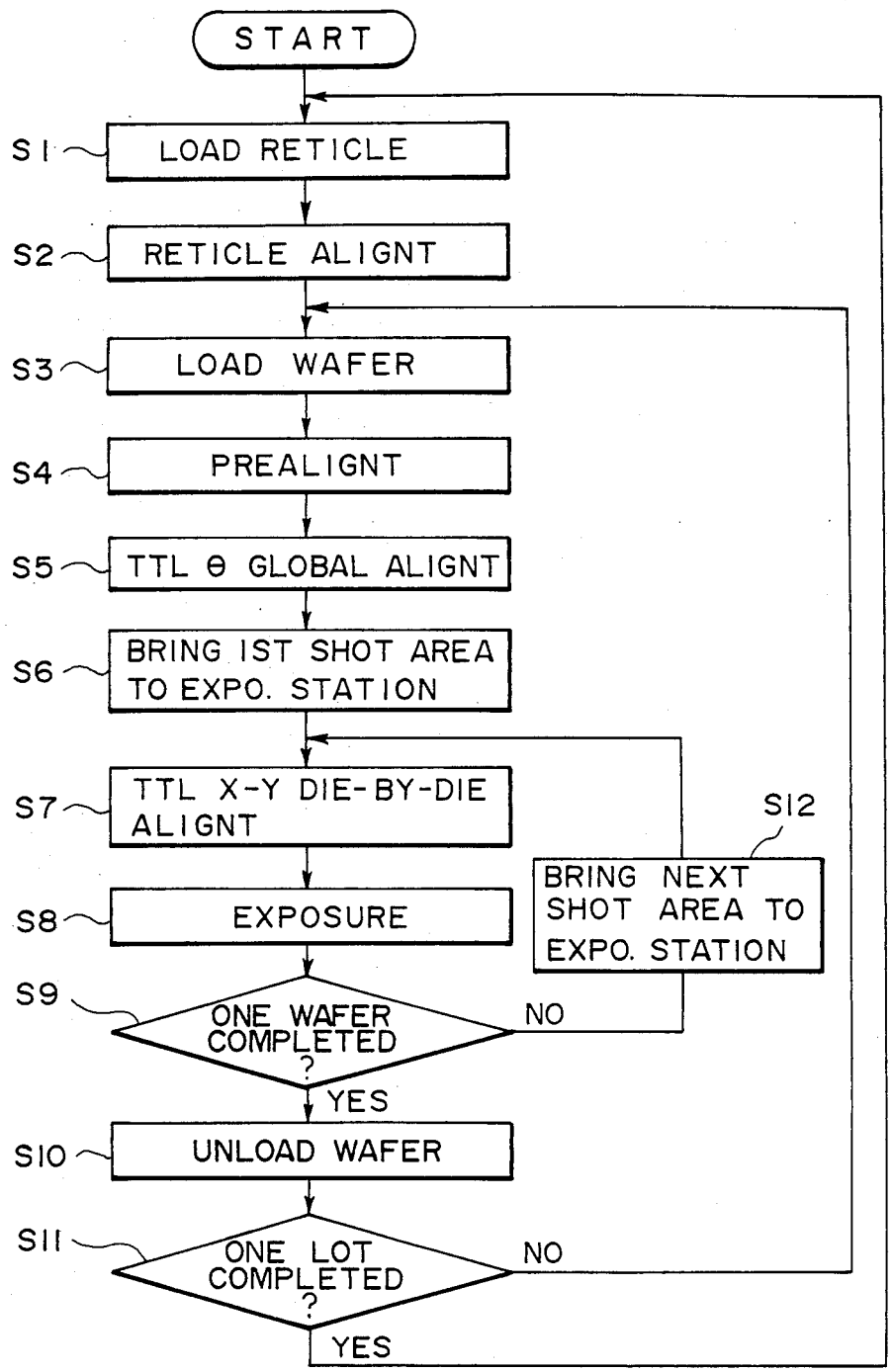
FIG. 3 is a flow chart showing the sequence of an alignment and exposure operation in accordance with an embodiment of the present invention.
Figure 4:
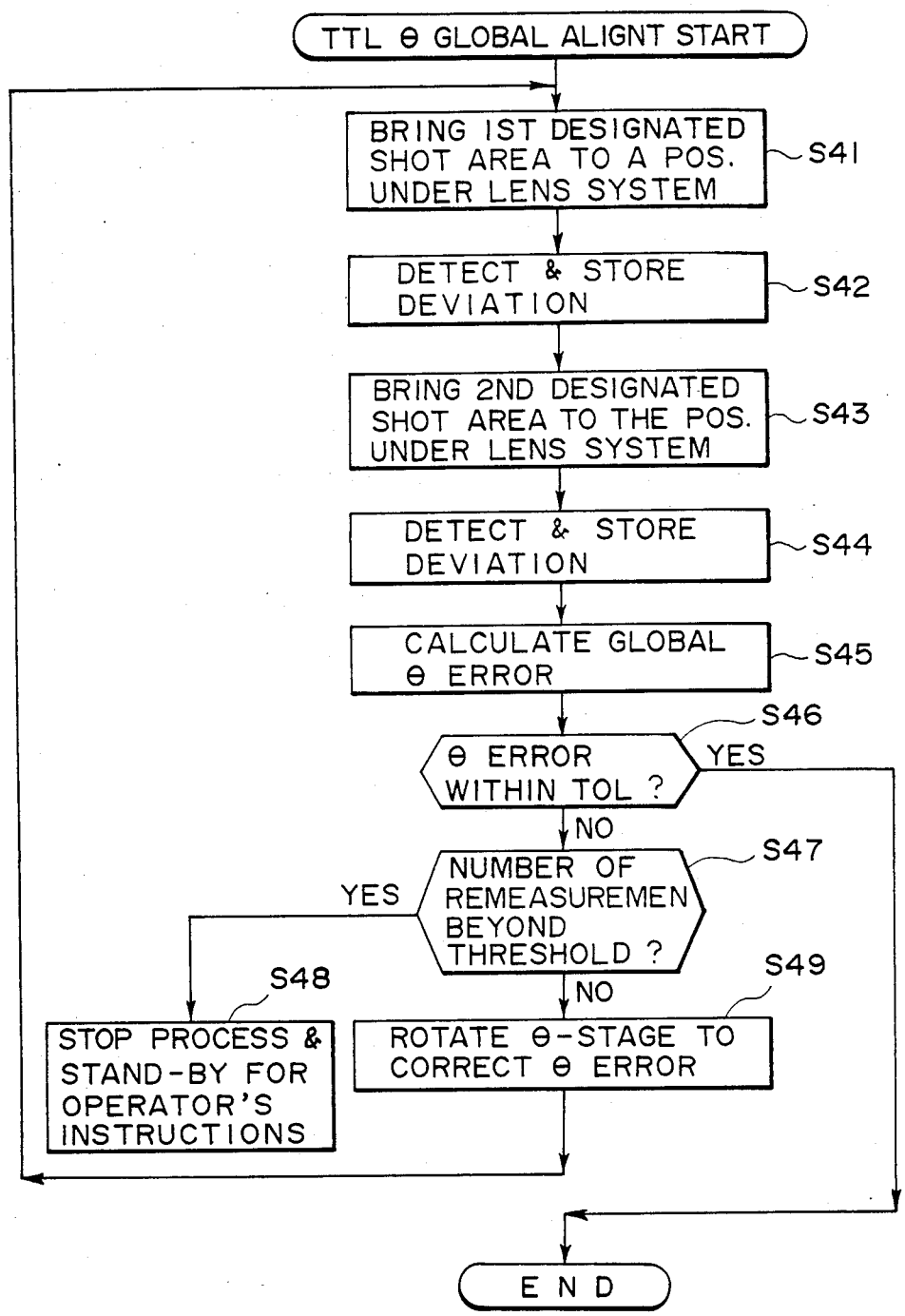
FIG. 4 is a flow chart showing the sequence of TTL $\theta$ global alignment in accordance with one aspect of the present invention.

FIG. 3 is a flow chart showing the sequence of the alignment and exposure operation for photoprinting images of the pattern PT on the wafer WF, wherein the alignment is achieved in accordance with one aspect of the present invention. Also, FIG. 4 is a flow chart showing the sequence of the alignment according to the present invention. More particularly, FIG. 4 is a chart explicating details of deviation measurement and so on that are to be executed at Step S5 shown in FIG. 3.

Now, reference will be made to FIGS. 2 and 3 to describe the manner of the alignment and exposure operation of the apparatus shown in FIG. 1.

When, in FIG. 3, the operation starts, the reticle RT is disposed, in place, on the reticle stage RS (Step S1). Subsequently, at Step S2, by using reticle alignment marks (not shown) provided on the projection lens system LN, the position of the reticle RT is adjusted so that it is accurately aligned with respect to the projection lens system LN. Thereafter, at Step S3, the wafer WF which is actually to be subjected to the photoprinting, is placed on the X-Y stage XYS. At Step S4, the prealignment marks PM1 and PM2 (FIG. 2) are detected by the off-axis microscope OA which is provided outside the projection lens system LN. By this detection, data or positional information necessary for relatively roughly aligning the wafer WF with the reticle RT, is obtained. Subsequently, at Step S5, TTL θ global alignment is executed. Details of this alignment will be described later. Briefly, by this alignment, the reticle RT and the wafer WF are accurately aligned with each other, with respect to the rotational component of the positional deviation therebetween. Then, at Step S6, the X-Y stage XYS is driven so as to bring the first shot area (No. 1 in FIG. 2) of the wafer WF to a predetermined position that is within the range of the projection field LN' of the projection lens system LN. At Step S7, TTL X-Y die-by-die alignment is executed so as to accurately align the reticle RT with the wafer WF, with respect to the translational components of the positional deviation therebetween. Details of this TTL X-Y alignment will be described later.

At Step S8, exposure or photoprinting is executed. Thereafter, at Step S9, discrimination is made as to whether or not the photoprinting is completed with respect to all the shot areas on one wafer, such as the wafer WF. If not completed, the sequence goes to Step S12 whereat the wafer WF is moved by the stage XYS so that the next shot area is brought into the projection field LN'. Then, the sequence goes back to Step S7. If the result of discrimination at Step S9 shows that the photoprinting of all the shot areas on the wafer WF is completed, the wafer WF is unloaded from the X-Y stage XYS (Step S10). At Step S11, discrimination is made as to whether or not the photoprinting of wafers of a number, that has been preparatorily designated and that corresponds to the number of wafers in one "lot", is completed. If not completed, the sequence goes back to Step S3. If completed, on the other hand, the sequence goes back to Step S1 so that the above-described operations are repeated.

Figure 5:
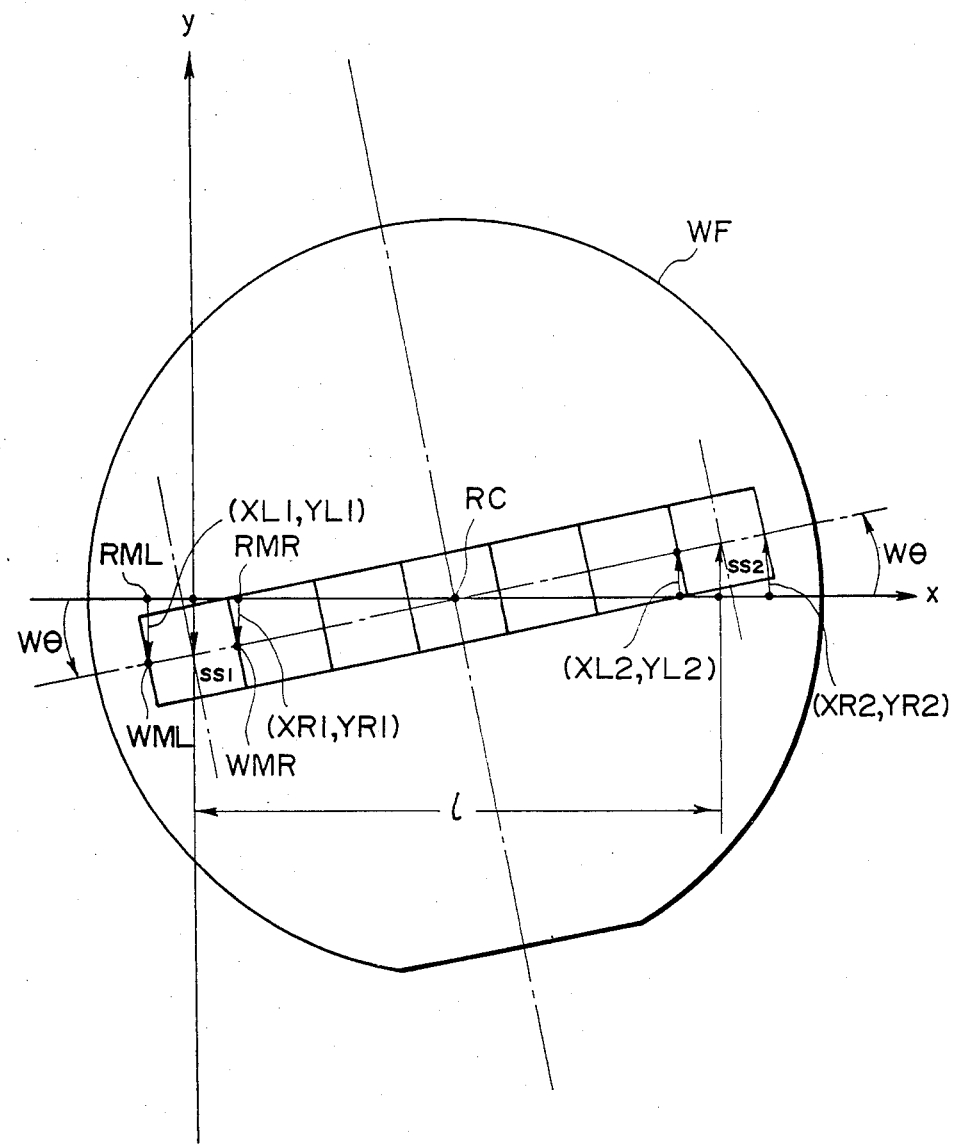
FIG. 5 is a schematic view showing a wafer having a rotational deviation component that is to be removed by TTL $\theta$ global alignment in accordance with one aspect of the present invention.

Referring to FIGS. 4 and 5, description will now be made to the TTL θ global alignment to be made at Step S5 of FIG. 3. In FIG. 5, the X-Y coordinate system has an origin which is on the optical axis of the projection lens system LN.

First, at Step S41 of FIG. 4, the wafer is moved by the X-Y stage XYS so that a first one of designated shot areas (e.g. a shot area SS1 of FIG. 5) is brought to a position just underneath the projection lens system LN. These shot areas have been preparatorily designated for the deviation measurement purpose. Then, at Step S42, the detectors DR and DL are used so as to measure or detect any deviation, in the X and Y directions, of alignment marks WML and WMR (which are on the left-hand and right-hand sides of the shot area SS1) with respect to alignment marks RMR and RML formed on the reticle RT, respectively. The detected deviation is stored into a memory, such as a random access memory (RAM), provided in the control box CB. For explanation purpose, the amount of detected deviation is expressed as follows:

XR1: The deviation component, in the X direction, of the right-hand wafer alignment mark WMR with respect to the reticle alignment mark RMR.

YR1: The deviation component, in the Y direction, of the right-hand wafer alignment mark WMR with respect to the reticle alignment mark RMR.

XL1: The deviation component, in the X direction, of the left-hand wafer alignment mark WML with respect to the reticle alignment mark RML.

YL1: The deviation component, in the Y direction, of the left-hand wafer alignment mark WML with respect to the reticle alignment mark RML.

Subsequently, at Step S43, a second one of the designated shot areas, for the deviation measurement, such as a shot area SS2 shown in FIG. 5, is brought to the position underneath the projection lens system LN with the aid of the X-Y stage XYS. Then, at Step S44, the detectors DR and DL are used to measure or detect any deviation of the current shot area (SS2) in the X-Y coordinate system having its origin coincident with the optical axis of the projection lens system LN. The manner of measurement is the same as has been made with reference to the preceding shot area. The detected deviation is stored into the above-described memory means.

Similarly to the case of the first designated shot area, the shot area SS2 has alignment marks and the detected deviation thereof is expressed in terms of XR2, YR2, XL2 and YL2. It is to be noted that, in the case of FIG. 5, the shot area SS2 has a center that is in a symmetrical relation with the center of the shot area SS1 with respect to the center RC of rotation of the wafer WF that is defined by the $\theta$ stage WS (see FIG. 1).

On the basis of the deviations stored in the memory means, any inclination $W\theta$ of the wafer WF is calculated at Step S45, in accordance with the following equation:

$$W\theta = [(YR2 + YL2) + (YR1 + YL1)]/2l$$

wherein l is the distance between the centers of the shot areas SS1 and SS2.

At Step S46, discrimination is made as to whether an absolute value of the magnitude of the inclination $W\theta$ is greater than a preset value. If it is greater than the preset value, the sequence goes to Step S47. At Step S47, discrimination is made as to the number of remeasurements that have been made with respect to one and the same wafer. If the number is greater than a predetermined value, it is discriminated that the inclination $W\theta$ has not been corrected sufficiently, such that the sequence goes to Step S48 to stop the process. By this, the apparatus is brought into a stand-by state, waiting for an operator's instructions.

If, on the other hand, the result of discrimination at Step S47 shows that the number of remeasurements is less than the predetermined threshold, the sequence goes to Step S49 whereat the $\theta$ stage WS is rotationally moved about the center RC by an amount corresponding to "$-W\theta$". As described, the inclination of the wafer WF as a whole is detected on the basis of the deviations having been detected with respect to two shot areas on the wafer WF which are spaced from each other by a substantial distance. Therefore, the inclination can be detected very precisely and, as a result of which, accurate wafer alignment with minimum die-rotation is attainable.

After the rotation of the $\theta$ stage WS at Step S49, the sequence goes back to Step S41 for the deviation measurement with respect to the designated shot area.

If the result of discrimination at Step S46 shows that the absolute value of the inclination $W\theta$, detected at Step S45, is less than the preset value, the alignment according to the TTL $\theta$ global alignment process of the present invention is completed. It is to be noted that the deviation components in the X and Y directions, detected in the above-described process, provide data to be used in aligning the first shot area of the wafer WF with respect to a predetermined position within the projection field LN' of the projection lens system LN.

Figure 6:
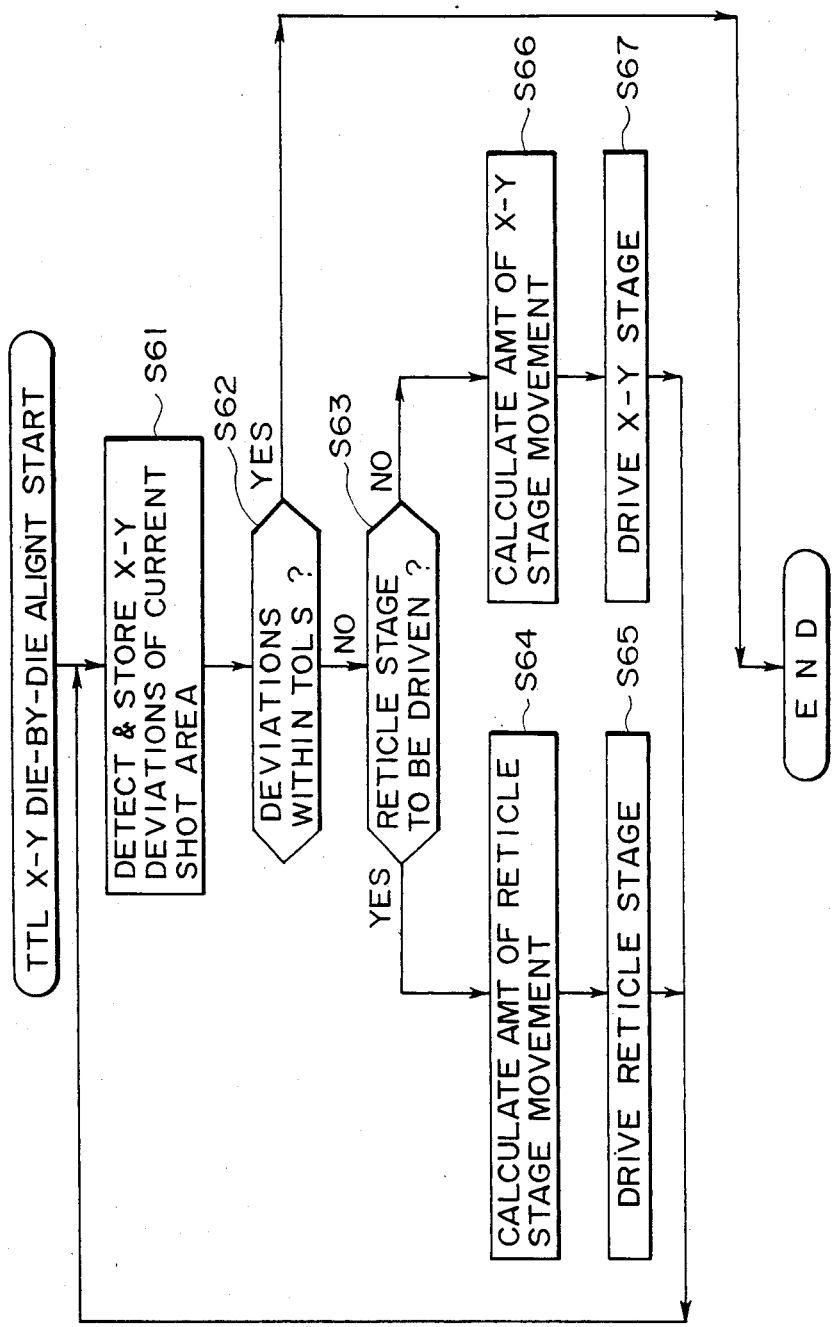
FIG. 6 is a flow chart showing the sequence of TTL X-Y die-by-die alignment in accordance with one aspect of the present invention.

Referring to FIGS. 6 and 7, description will now be made to details of the TTL X-Y die-by-die alignment to be executed at Step S7 shown in FIG. 3. In FIG. 7, the illustrated X-Y coordinate system has its origin coincident with the optical axis of the projection lens system LN.

First, at Step S61, deviation measurement is executed with respect to a current shot area that is just going to be subjected to the photoprinting. More specifically, by using the detectors DR and DL, any deviation of alignment marks WML and WMR, which are formed on left-hand and right-hand sides of the current shot area, with respect to the alignment marks RMR and RML formed on the reticle RT, respectively, is measured or detected. The detected deviation is stored into memory means, such as a random access memory (RAM), provided in the control box CB. For explanation purpose, the amount of detected deviation is expressed as follows:

XR3: The deviation component, in the X direction, of the right-hand wafer alignment mark WMR with respect to the reticle alignment mark RMR, YR3: The deviation component, in the Y direction, of the right-hand wafer alignment mark WMR with respect to the reticle alignment mark RMR, XL3: The deviation component, in the X direction, of the left-hand wafer alignment mark WML with respect to the reticle alignment mark RML, YL3: The deviation component, in the Y direction, of the left-hand wafer alignment mark WML with respect to the reticle alignment mark RML.

As will be readily understood also from FIG. 7, the rotational deviation component of the wafer WF has been substantially fully corrected by the execution of the above-described TTL $\theta$ global alignment. Thus, the rotational deviation component, if any, of the wafer WF shown in FIG. 7 is of an amount that can be disregarded.

Subsequently, at Step S62, discrimination is made as to whether the translational deviation components XR3, YR3, XL3 and YL3, in the X and Y directions, are less than respectively preset values. If, as a result of this discrimination, at least one of the deviation components is greater than the preset value that has been determined therefor, the sequence goes to Step S63. At Step S63, discrimination is made as to whether the reticle stage RS is to be moved or, alternatively, the X-Y stage XYS is to be moved, for correcting the deviation. For this discrimination purpose, the above-described deviation components are compared with a predetermined threshold. If the deviation components are less than the predetermined threshold, such that the reticle stage RS is to be driven for the deviation correction purpose, the sequence goes to Step S64 and, on the basis of the detected deviation components, the amounts of correcting movement, i.e. RX and RY, to be made by the reticle stage RS in the X and Y directions are calculated. The calculation is made in accordance with the following equations:

$$RX = (XR3 + XL3)/(2 \times RU)$$

$$RY = (YR3 + YL3)/(2 \times RU)$$

wherein RU is the resolution of driving movement of the reticle stage.

Subsequently, the sequence goes to Step S65 and the reticle stage RS is driven in the X and Y directions by amounts corresponding respectively to the calculated amounts of X-Y movement, i.e. RX and RY.

If, on the other hand, the result of discrimination at Step S63 shows that the deviation components are greater than the predetermined threshold so that the X-Y stage XYS is to be driven for the deviation correction purpose, the sequence goes to Step S66 whereat the amounts of correcting movement of the X-Y stage XYS, i.e. XYX and XYY, are calculated. The calculation is made in accordance with the following equations:

$$XYX = (XR3 + XL3)/(2 \times XYU)$$

$$XYY = (YR3 + YL3)/(2 \times XYU)$$

wherein XYU is the resolution of the driving movement of the X-Y stage XYS.

Subsequently, the sequence goes to Step S67 and the X-Y stage XYS is driven in the X and Y directions by amounts corresponding respectively to the calculated amounts of X-Y movement, i.e. XYX and XYY.

After completion of the correcting movement at Step S65 or S67, described above, the sequence goes back to Step S61 such that the degree of alignment between the reticle RT and the current shot area of the wafer WF is examined.

If, on the other hand, the discrimination at Step S65 shows that all the deviation components in the X and Y directions of the current shot area with respect to the reticle RT are less than the respectively preset values, it is discriminated that the alignment of the current shot area of the wafer with the reticle RT is satisfactory, such that the TTL X-Y die-by-die alignment according to the present invention is completed.

As will be understood from FIG. 3, this alignment operation is executed for each of the shot areas of the wafer and just before the execution of the photoprinting.

In accordance with the improved alignment method of the present invention, as has hitherto been described, the measurement and correction of the deviation in respect to the rotational component are made in regard to the wafer as a whole, thus attaining high-accuracy and high-speed alignment. On the other hand, in respect to the translational deviation component, the measurement and correction thereof are made for each of the shot areas on the wafer. This assures accurate alignment regardless of any positional errors of shot areas on the wafer, which appear regionally or locally on the wafer, due to environmental conditions (particularly an ambient temperature) of the wafer as well as any errors in the step-feeding accuracy of the X-Y stage.

While the invention has been described with reference to the structures disclosed herein, it is not confined to the details set forth and this application is intended to cover such modifications or changes as many come within the purposes of the improvements or the scope of the following claims.

What is claimed is:

1. A method, usable in sequentially and photolithographically transferring images of a pattern of an original onto different portions of a photosensitive workpiece while stepwisely moving the workpiece in steps, for aligning the original and workpiece with each other, said method comprising the steps of:

detecting and correcting, with respect to a rotational component of deviation between the original and the workpiece, a rotational component of deviation of the workpiece as a whole with respect to the original; and detecting and correcting, with respect to a translational component of deviation between the original and the workpiece, a translational component of deviation of each of the different portions of the workpiece with respect to the original, just prior to the transfer of a photolithographic image to the different portions of the workpiece;

said detecting and correcting step for detecting and correcting the rotational component of the deviation of the workpiece as a whole, including a closed-loop processing routine adapted to discriminate, after the detection and before correction, the magnitude of the detected deviation component in comparison with a predetermined threshold and adapted to execute again, after the correction, the detection and correction of the rotational component of the deviation when the magnitude of the first-detected rotational component of the deviation is greater than the predetermined threshold.

2. A method, usable in sequentially and photolithographically transferring images of a pattern of an original onto different portions of a photosensitive workpiece while moving the workpiece in steps, for aligning the original and workpiece with each other, said method comprising the steps of:

detecting and correcting, with respect to a rotational component of deviation between the original and the workpiece, a rotational component of deviation of the workpiece as a whole with respect to the original; and detecting and correcting, with respect to a translational component of the deviation between the original and the workpiece, a translational component of deviation of each of the different portions of the workpiece with respect to the original, just prior to the transfer of a photolithographic image to the different portions of the workpiece; and the detecting and correcting step for detecting and correcting the translational component of the deviation including a closed-loop processing routine adapted to discriminate, after the detection and before the correction of the translational component, the magnitude of the translational component in comparison with a predetermined threshold and adapted to execute again, after the correction of the translational component, the detection and correction of the translational component of the deviation when the magnitude of the first-detected translational component of the deviation is greater than the predetermined threshold.

3. A method of aligning, in sequence, different portions of a first object with a second object having a pattern, said method comprising the steps of:

placing the first object on a stage which is movable in first and second rectilinear directions and in a rotational direction parallel to a plane containing the first and second directions;

detecting positional deviation of the first object with respect to the second object in the rotational direction by use of an optical system for projecting an image of the pattern of the second object onto one of the different portions of the first object;

correcting the detected deviation of the first object in the rotational direction by use of the stage;

detecting, each time one of the different portions of the first object, having its rotational deviation corrected, is moved to a position whereat the image of the pattern of the second object is projected, positional deviation of the one portion of the first object with respect to the second object and in the first and second directions by use of the optical system; and correcting the deviation of the one portion of the first object in the first and second directions by use of the stage and without rotationally moving the first object.

4. A method according to claim 3, wherein the image of the pattern of the second object is photolithographically transferred onto each of the different portions of the first object by way of the optical system.

5. An alignment method, usable in a projection exposure apparatus having a projection optical system for projecting in sequence images of a pattern of an original onto different portions of a workpiece, for aligning each portion of the workpiece with respect to the pattern, said method comprising the steps of:

measuring a rotational deviation of the workpiece as a whole with respect to the pattern of the original;

comparing the measured rotational deviation of the workpiece with a predetermined threshold;

correcting, when the measured rotational deviation of the workpiece is greater than the threshold, the measured rotational deviation of the workpiece by rotating the workpiece relative to the original;

repeating at least said rotational deviation measuring and comparing steps;

measuring, when each portion of the workpiece is brought to a position on which the image of the pattern of the original is projected, a translational deviation of the portion with respect to the pattern of the original in first and second orthogonal directions; and correcting the measured translational deviation of the portion of the workpiece without further rotating the workpiece relative to the original.

6. A method according to claim 5, wherein the rotational deviation of the workpiece as a whole with respect to the original is measured by detecting, by use of the projection optical system, alignment marks provided in relation to separate portions of the workpiece.

7. A method according to claim 5, wherein the measured translational deviation of each portion of the workpiece is compared with a predetermined threshold and, when the measured translational deviation is greater than the threshold, it is corrected and thereafter at least said translational deviation measuring and comparing steps with respect to the portion of the workpiece are repeated.

8. An alignment method, usable in a projection exposure apparatus having a projection optical system for projecting in sequence images of a pattern of an original upon different portions of a workpiece, for aligning each portion of the workpiece with respect to the pattern, said method comprising the steps of:

measuring a rotational deviation of the workpiece as a whole with respect to the pattern of the original;

correcting the measured rotational deviation of the workpiece by rotating the workpiece relative to the original;

measuring, when each portion of the workpiece is brought to a position on which the image of the pattern of the original is projected, a translational deviation of the portion with respect to the pattern of the original in first and second orthogonal directions;

comparing the measured translational deviation of the portion with a predetermined threshold;

correcting, when the measured translational deviation of the portion is greater than the threshold, the measured translational deviation of the portion of the workpiece without further rotating the workpiece relative to the original, and repeating, after the correction of the translational deviation, the steps of at least measuring and comparing the translational deviation.

9. A method according to claim 8, wherein the rotational deviation of the workpiece as a whole with respect to the original is measured by detecting, by use of the projection optical system, alignment marks provided in relation to separate portions of the workpiece.

* * * * *